United States Patent
Fleissner et al.

(10) Patent No.: US 9,832,838 B2
(45) Date of Patent: Nov. 28, 2017

(54) OPTOELECTRONIC ASSEMBLY AND METHOD FOR DETECTING AN ELECTRICAL SHORT CIRCUIT

(71) Applicant: OSRAM OLED GmbH, Regensburg (DE)

(72) Inventors: Arne Fleissner, Regensburg (DE); Daniel Riedel, Regensburg (DE); Nina Riegel, Tegernheim (DE); Silke Scharner, Regensburg (DE); Johannes Rosenberger, Regensburg (DE); Thomas Wehlus, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/326,502

(22) PCT Filed: Jul. 2, 2015

(86) PCT No.: PCT/EP2015/065116
§ 371 (c)(1),
(2) Date: Jan. 16, 2017

(87) PCT Pub. No.: WO2016/008735
PCT Pub. Date: Jan. 21, 2016

(65) Prior Publication Data
US 2017/0215249 A1   Jul. 27, 2017

(30) Foreign Application Priority Data

Jul. 17, 2014 (DE) .................. 10 2014 110 050

(51) Int. Cl.
*H05B 33/08* (2006.01)
*H01L 51/00* (2006.01)
*H01L 27/32* (2006.01)

(52) U.S. Cl.
CPC ..... *H05B 33/0896* (2013.01); *H01L 27/3202* (2013.01); *H01L 27/3276* (2013.01); *H01L 51/0031* (2013.01); *H05B 33/089* (2013.01)

(58) Field of Classification Search
None
See application file for complete search history.

(56) References Cited

U.S. PATENT DOCUMENTS

| 5,744,961 A | 4/1998 | Otaka |
| 2005/0242822 A1 | 11/2005 | Klinger |

(Continued)

FOREIGN PATENT DOCUMENTS

| DE | 953410 C | 11/1956 |
| DE | 19643908 A1 | 5/1997 |

(Continued)

OTHER PUBLICATIONS

International Search Report based on Application No. PCT/EP2015/065116 (3 pages + 2 pages English translation) dated Nov. 16, 2015.

(Continued)

*Primary Examiner* — Jany Richardson
(74) *Attorney, Agent, or Firm* — Viering, Jentschura & Partner mbB

(57) ABSTRACT

In various embodiments, an optoelectronic assembly may include at least one organic light emitting diode including a first light emitting diode element and a second light emitting diode element, and an electronic circuit. The first light emitting diode element and the second light emitting diode element are electrically connected in parallel and are deposited monolithically on a common substrate, and the electronic circuit is designed to compare an electric current through the first light emitting diode element that flows during operation with an electric current through the second light emitting diode element that flows during operation and, (Continued)

depending on the comparison, to detect a short circuit of the first light emitting diode element or of the second light emitting diode element and to initiate an electrical switching off of one of the light emitting diode elements and/or of the assembly.

5 Claims, 2 Drawing Sheets

(56) References Cited

U.S. PATENT DOCUMENTS

| | | |
|---|---|---|
| 2010/0214210 A1 | 8/2010 | Aso et al. |
| 2012/0200296 A1* | 8/2012 | Avenel ............... H05B 37/032 324/414 |
| 2013/0175948 A1* | 7/2013 | Ogata ............... H05B 33/0818 315/297 |
| 2013/0314064 A1 | 11/2013 | Theiler |

FOREIGN PATENT DOCUMENTS

| | | |
|---|---|---|
| DE | 19708659 C1 | 5/1998 |
| DE | 19916080 A1 | 10/2000 |
| DE | 10107578 A1 | 8/2002 |
| DE | 10215486 C1 | 10/2003 |
| DE | 102004027676 A1 | 11/2005 |
| EP | 2487999 A1 | 8/2012 |
| WO | 02066290 A1 | 8/2002 |
| WO | 2012079995 A1 | 6/2012 |

OTHER PUBLICATIONS

German Search Report based on Application No. 10 2014 110 050.6 (8 pages) dated Mar. 19, 2015.

* cited by examiner

OPTOELECTRONIC ASSEMBLY AND METHOD FOR DETECTING AN ELECTRICAL SHORT CIRCUIT

RELATED APPLICATIONS

The present application is a national stage entry according to 35 U.S.C. §371 of PCT application No.: PCT/EP2015/065116 filed on Jul. 2, 2015, which claims priority from German application No.: 10 2014 110 050.6 filed on Jul. 17, 2014, and is incorporated herein by reference in its entirety.

TECHNICAL FIELD

Various embodiments generally relate to an optoelectronic assembly including at least one first light emitting diode element and one second light emitting diode element, and to a method for detecting an electrical property of a first light emitting diode element or of a second light emitting diode element.

BACKGROUND

Optoelectronic components which emit light can be for example light emitting diodes (LEDs) or organic light emitting diodes (OLEDs). An OLED may include an anode and a cathode with an organic functional layer system therebetween. The organic functional layer system may include one or a plurality of emitter layers in which electromagnetic radiation is generated, a charge generating layer structure composed of respectively two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

Optoelectronic assemblies include for example two or more optoelectronic components, for example LEDs and/or OLEDs, and drive circuits, for example drivers, for operating the optoelectronic components. The optoelectronic components can be electrically connected in parallel, for example. An optoelectronic component, for example an OLED, can be segmented and therefore include a plurality of OLED elements. The OLED elements can for example be electrically connected in parallel and/or share at least one common electrode. By way of example, two OLED elements include the same cathode, but have organic functional layer structures separated from one another and anodes correspondingly separated from one another. This can contribute to the fact that, in the case of a short circuit of one of the OLED elements, the other OLED elements can in principle continue to be operated.

Despite elaborate quality control procedures for OLEDs, the situation in which the OLEDs fail spontaneously in use cannot be completely ruled out. A typical fault pattern for spontaneous failures is short circuits between the electrodes. Such short circuits are generally over a small area; a large part of the total current is thus concentrated at this short-circuit point. Consequently, the current density is significantly boosted, as a result of which these locations can heat up to a very great extent depending on the areal embodiment. This can lead to the melting of the electrodes, to dark spots in the luminous image, to completely dark OLEDs and/or simply to locations becoming very hot on the OLED. In order to prevent potential hazards as a result of this overheating (combustion hazard, fire, rupture) such a short circuit should be detected by the drive or driver electronics or a subordinate evaluation unit and/or computing unit and a corresponding reaction, for example a protection measure, should be implemented (switching off of the short-circuited component, generation of warning signals, bypassing, that is to say circumvention of the short circuit, etc.). Precisely in the automotive sector, the manufacturers demand that for example defective OLEDs or LEDs in rear lights must be electronically detected and at least reported to the on-board system.

For detecting a short circuit during the operation of an OLED, which can occur in individual components of the OLED, conventional fuses are known, the functional principle of which is based, inter alia, on the current flowing via the short circuit and the voltage change associated therewith.

During the operation of the OLED it is furthermore possible for a local defect to occur which locally increases the conductivity between anode and cathode of the OLED, without a complete short circuit being generated in the process. To put it another way, here a so-called conditional short circuit is generated in which a voltage dropped across the short circuit is not reduced to a completely negligible measure. A conventional fuse interconnected with the OLED affords no protection against this since, in the conditional short circuit, the voltage dropped across the OLED does not decrease or the total current flowing through the OLED does not necessarily increase. Therefore, the total resistance of the OLED does not change. With external voltage remaining the same and external current remaining the same, a localization and/or concentration of the current in the local defect occurs. In a case of a conditional short circuit of an OLED, a conventional fuse accordingly does not necessarily lead to an interruption of the operation of the OLED.

In the case of a conditional short circuit, the majority of the current disadvantageously flows through the local defect, as a result of which the local current density increases. This can disadvantageously lead to a local overheating at the relevant location of the local defect. An injury hazard, such as, for example, a combustion hazard upon direct contact with the OLED, and a fire hazard which are based on the local overheating of the OLED can occur here, even with the use of a conventional fuse as described above.

SUMMARY

Therefore, various embodiments specify an optoelectronic assembly which can be operated safely and/or with high quality and enables in particular detection of at least one electrical property, in particular of a short circuit, of at least one component, in particular of a light emitting diode element, of the optoelectronic assembly.

Various embodiments further provide a method for detecting an electrical property, for example a short circuit, in a light emitting diode element which can be carried out simply and/or cost-effectively and/or which contributes to safe and high-quality operation of the light emitting diode element and/or of an optoelectronic assembly including the light emitting diode element.

The object is achieved in accordance with one aspect of the disclosure by means of an optoelectronic assembly including at least one first light emitting diode element, a second light emitting diode element and an electronic circuit. The first light emitting diode element and the second light emitting diode element are electrically connected in parallel. The electronic circuit is designed to compare an electric current through the first light emitting diode element that flows during operation with an electric current through the second light emitting diode element that flows during operation. The electronic circuit is designed to detect at least one electrical property of the first light emitting diode element or of the second light emitting diode element depending on the comparison.

The electronic circuit accordingly makes it possible, by means of the comparison of the currents flowing during operation, to detect at least one electrical property of one of the light emitting diode elements. The knowledge thus obtained about the electrical property can advantageously be used for avoiding hazards such as, for example, an injury hazard and/or a fire hazard. The safety during the operation of the optoelectronic assembly thus advantageously increases.

The electronic circuit preferably includes a comparison unit for comparing the currents of the light emitting diode elements, which comparison unit carries out the comparison.

An evaluation unit is preferably used for detecting the at least one electrical property, which evaluation unit assigns an electrical property for example to a determined compared value of the currents. In this case, it is not absolutely necessary for the comparison unit and the evaluation unit to form different components of the circuit. Rather, it is possible for a single component of the circuit to perform the function of the comparison unit and of the evaluation unit.

In the present case, therefore, the electronic circuit is integrated in the optoelectronic assembly, which electronic circuit provides a method for detecting at least one electrical property of the light emitting diode elements of the assembly. In this case, the detection method is based on the comparison of the currents that flow through the light emitting diode elements during operation.

The first and second light emitting diode elements can be in each case for example an individually operated LED or OLED, an individual LED or OLED which is operated together with other LEDs and/or OLEDs, for example by means of the electrical coupling of their cathodes or anodes, or a segment of a multi-segment OLED with the respective other or plurality of light emitting diode elements which include a common cathode or anode. By way of example, the first and second light emitting diode elements can be driven separately in each case alongside other individual LEDs, OLEDs or OLED segments, for example for realizing dynamic light effects, for example in the automotive sector, for example for representing flashing indicator scenarios and/or welcome scenarios.

In accordance with one development, the at least one electrical property is a short circuit of the corresponding light emitting diode element. In the present case, the short circuit is detected by the current comparison of the light emitting diode elements. By detecting the short circuit of one of the light emitting diode elements by means of the electronic circuit, it is advantageously possible to rule out an injury hazard and/or a fire hazard which can occur as a result of a local overheating in the case of a conditional short circuit.

In the case of light emitting diode elements deposited in a common process, light emitting diode elements having virtually identical current-voltage characteristics can be taken as a basis. To put it another way, currents of approximately identical magnitude flow through the first light emitting diode element and the second light emitting diode element during normal operation. If a conditional short circuit then occurs in one of the light emitting diode elements, the majority of the impressed current flows through this local defect, as a result of which the current flow through the corresponding light emitting diode element increases. The current flow through the other light emitting diode element, not having a short circuit, correspondingly decreases. As a result, an increased difference magnitude of the currents occurs, on the basis of which the conditional short circuit can be detected by means of comparison of said currents. Safe operation of the optoelectronic assembly is advantageously made possible.

In the case of light emitting diode elements having different current-voltage characteristics, a short-circuit detection can likewise be carried out by means of a current comparison. For this purpose, the electronic circuit is calibrated to the difference between the currents that already exists initially. In this case, however, the electronic circuit is coordinated with an already existing difference magnitude, such that a deviation from this difference magnitude that occurs during normal operation can be detected.

Alternatively or additionally, the individual light emitting diode elements of the optoelectronic assembly can be selected in a manner appropriately matching one another for the current comparison. Light emitting diode elements having manufacturing fluctuations which may be reflected, inter alia, in the current-voltage characteristics of the individual light emitting diode elements can thus already be differentiated before the current comparison.

In accordance with one development, the at least one electrical property is an electrical conductivity of the corresponding light emitting diode element. Particularly when a local defect occurs, such as a conditional short circuit, for example, the electrical conductivity between anode and cathode can increase, as a result of which the majority of the current flows through this local defect and the local current density increases. Determining the electrical conductivity and, in particular, detecting deviations of the electrical conductivity from normal operation thus allow the detection of a local defect of the corresponding light emitting diode element of the optoelectronic assembly. Safe and high-quality operation of the optoelectronic assembly is thus advantageously made possible.

In accordance with one development, the at least one electrical property is a current flow through the corresponding light emitting diode element. When a conditional short circuit occurs in one of the light emitting diode elements, the current flow through this light emitting diode element increases. An increased difference magnitude of the currents can be detected by means of the electronic circuit and conclusions can be drawn about a local defect. Here, too, safe and high-quality operation of the optoelectronic assembly is made possible.

Detecting one of the properties mentioned above accordingly allows a detection of local defects and of deviations from normal operation. Besides ruling out hazards, such as, for example, an injury or fire hazard, this can serve for the quality control of individual light emitting diode elements and thus of the entire optoelectronic assembly. If significantly different currents among the individual light emitting diode elements are already present here in a test method after the manufacture of the optoelectronic assembly, then a defective optoelectronic assembly should be assumed. This defective optoelectronic assembly can advantageously be segregated directly after the test method, as a result of which the sale and/or the operation of defective optoelectronic assemblies can be avoided.

In accordance with one development, the electronic circuit is designed to identify the at least one electrical property in the case of a difference magnitude of the currents to be compared which exceeds a predefined difference magnitude. To put it another way, the at least one electrical property is detected if a predefined or stipulated excessively large difference magnitude between the currents to be compared occurs. This exceedance of the difference magnitude can be detected for example by means of the evaluation unit which carries out the comparison of the currents that flow through the light emitting diode elements, and which, after this current comparison, compares the result of the current comparison with the predefined difference magnitude. Detection of the corresponding electrical property is initiated in the case of an increased deviation from the predefined difference magnitude. Inter alia, the localization of local defects of the optoelectronic assembly is advantageously made possible as a result.

A difference magnitude should be understood to mean, in particular, that a difference between two magnitudes, that is to say positive numbers, is taken. In other words, in the present case, one of the currents is subtracted sign-positively from the other of the currents. If a deviation from zero is ascertained, which can be classified as excessively increased taking account of possible manufacturing-dictated fluctuations, a local defect, for example a short circuit, should be assumed.

In accordance with one development, the electronic circuit is designed, in the case of exceedance, to initiate an electrical switching off of one of the light emitting diode elements and/or of the assembly. To put it another way, upon detection of local defects, the defective light emitting diode element and/or the entire optoelectronic assembly is switched off by means of the electronic circuit. An interruption of the operation of the defective light emitting diode element and/or of the optoelectronic assembly is advantageously made possible as a result. The switching off by means of the electronic circuit is carried out for example via at least one switch which interrupts the electrical circuit or circuit. In order to provide a partial switching off of the individual light emitting diode elements when a defect occurs, the electronic circuit preferably includes, upstream or downstream of each light emitting diode element, a switch which respectively interrupts the electrical circuit or circuit only of the defective light emitting diode element. Such a switch can for example include or be formed by a transistor.

In accordance with one development, the electronic circuit includes at least one summation current transformer, a coil, a first electrical line of the first light emitting diode element and a second electrical line of the second light emitting diode element. The coil (45) is wound or wrapped around the summation current transformer (44). The first electrical line and the second electrical line are led through the summation current transformer. A current flow of the first electrical line and a current flow of the second electrical line are in opposite directions. To put it another way, the lines of the two light emitting diode elements run in opposite directions through the summation current transformer.

The summation current transformer adds in particular all currents flowing to and from the load correctly in terms of sign. In other words, induced currents of the lines add up to zero in a signed manner, if they have the same magnitude. During normal operation, however, the induction effects of the lines cancel one another out, as a result of which no magnetic flux is induced in the summation current transformer and no secondary current flows. Deviations in the currents and thus deviations from normal operation lead to a current in the coil, as a result of which a deviation from the summation to zero occurs.

Local defects can advantageously be detected on the basis of the current deviation.

In this case, the electronic circuit includes components and corresponding arrangements which are similar to a residual current protection circuit. A residual current protection circuit isolates the monitored electrical circuit in the event of a certain fault current being exceeded, that is to say if a current flowing in one line toward the load and a current flowing back in another line from the load no longer have the same magnitude and the signed currents do not add up to zero. Residual current protection circuits are sufficiently known to the person skilled in the art and, therefore, will not be discussed in any greater detail at this juncture.

In accordance with one development, the electronic circuit includes an integrated microelectronic circuit (IC). In this case, therefore, the comparison of the currents flowing through the light emitting diode elements and the detection of the electrical property are carried out by the integrated microelectronic circuit. Such a circuit, on account of its small size, can be fitted in or on the optoelectronic assembly in a simple and space-saving manner.

In accordance with one development, the assembly includes a plurality of light emitting diode elements. The electronic circuit is designed in each case to determine an electric current through each light emitting diode element that flows during operation and to compare the currents of the light emitting diode elements with one another. Depending on the comparison, the electronic circuit is designed to initiate an electrical switching off of at least one of the light emitting diode elements and/or of the optoelectronic assembly. In the present case, the optoelectronic assembly therefore includes n light emitting diode elements. In this case, n should be regarded as a non-negative integer that represents the number of light emitting diode elements in the assembly. The currents flowing through the n light emitting diode elements are compared and one of the light emitting diode elements, a plurality of the light emitting diode elements and/or the entire assembly are/is switched off depending on the comparison. In particular, a switching off is applied if one of the light emitting diode elements or a plurality of the light emitting diode elements has/have a correspondingly higher current, for example higher than the predefined difference magnitude, compared with the other light emitting diode elements.

Safe operation of an optoelectronic assembly which includes a plurality of light emitting diode elements can advantageously be made possible as a result. An injury and fire hazard can be ruled out in the present case for this optoelectronic assembly as well.

In accordance with one development, the first light emitting diode element and the second light emitting diode element are deposited monolithically on a common substrate. By way of example, the light emitting diode elements involve an in principle single optoelectronic assembly which, however, is manufactured in a segmented fashion. Said light emitting diode elements can be applied in a laterally structured fashion such that two light emitting diode elements which can be operated in parallel arise, the functional layers of which are deposited simultaneously in one process. As a result, it is advantageously possible to ensure that the two light emitting diode elements have as far as possible identical current-voltage characteristics. As a result, a comparison of the currents flowing through the light emitting diode elements and a deviation of said currents that is to be ascertained are possible in a simplified manner.

In accordance with one development, the first light emitting diode element and the second light emitting diode element are arranged in a manner stacked one above the other or laterally alongside one another. Besides the laterally segmented optoelectronic assembly as explained above, in the present case, accordingly, an optoelectronic assembly is also possible, inter alia, which is formed in a multiply stacked fashion by means of an intermediate electrode. In the case of an arrangement of the two light emitting diode elements stacked one above another, for the purpose of detecting the electrical property, the current through the lower light emitting diode element is compared with the current through the upper light emitting diode element. A space-saving optoelectronic assembly can advantageously be provided as a result of the stacked arrangement.

Such light emitting diode elements stacked one above another are sufficiently known to the person skilled in the art and, therefore, will not be discussed in any greater detail at this juncture.

The object is furthermore achieved by means of a method for detecting an electrical property of a first light emitting diode element or of a second light emitting diode element, wherein the first light emitting diode element and the second light emitting diode element are electrically operated in parallel. An electric current through the first light emitting diode element that flows during operation is compared with an electric current through the second light emitting diode element that flows during operation by means of an electronic circuit. The electrical property is detected depending on the comparison.

Accordingly, conclusions about at least one electrical property of one of the light emitting diode elements are advantageously possible by means of the electronic circuit. By way of example, local defects can thus be detected and advantageously additionally localized rapidly, reliably, with low outlay and in a space-saving manner. Safe operation of the light emitting diode elements which are installed jointly in an optoelectronic assembly, for example, can be made possible as a result.

In accordance with one development, a short circuit of the first light emitting diode element or of the second light emitting diode element is detected as the electrical property. In the present case, in particular hazards which can occur in the case of a conditional short circuit and which cannot be reduced or even ruled out by the use of a conventional, for example external, fuse can be detected and a corresponding reaction thereto can be effected.

In accordance with one development, the short circuit is detected in the case where the difference magnitude of the compared currents exceeds the predefined difference magnitude. To put it another way, the electrical property is detected if a predefined, excessively large difference magnitude between the currents is present. As a result, a short circuit, in particular a conditional short circuit, of one of the light emitting diode elements can be ascertained in a rapid and simple manner.

In accordance with one development, upon the exceedance of the predefined difference magnitude, an electrical switching off of at least one of the light emitting diode elements is initiated. As a result, it is advantageously possible to ensure that individual or a plurality of defective light emitting diode elements are switched off when a defect occurs. Possible hazards can thus be ruled out.

In accordance with one development, in each case an electric current through a plurality of light emitting diode elements that flows during operation is determined by means of the electronic circuit. The currents of the light emitting diode elements are compared with one another by means of the electronic circuit. One or a plurality of the light emitting diode elements is/are electrically switched off depending on the comparison.

As a result, a plurality of light emitting diode elements that are installed jointly in an optoelectronic assembly, for example, can advantageously be examined for local defects, as a result of which safe operation of this plurality of light emitting diode elements is possible. In this case, a partial switching off of individual light emitting diode elements or a switching off of all the light emitting diode elements, that is to say of the entire optoelectronic assembly, when a local defect occurs is possible. In the case of the partial switching off of individual light emitting diode elements on account of partially occurring defects, the still functioning light emitting diode elements can continue to be operated. Alternatively, it is possible, of course, to switch off the light emitting diode elements in their entirety, that is to say the entire optoelectronic assembly, when a defect occurs.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

An optoelectronic assembly may include one, two or more optoelectronic components. Optionally, an optoelectronic assembly can also include one, two or more electronic components. An electronic component may include for example an active and/or a passive component. An active electronic component may include for example a computing, control and/or regulating unit and/or a transistor. A passive electronic component may include for example a capacitor, a resistor, a diode or a coil.

An optoelectronic component can be an electromagnetic radiation emitting component. In various embodiments, an electromagnetic radiation emitting component can be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. In this context, the electromagnetic radiation emitting component can be formed for example as a light emitting diode (LED), as an organic light emitting diode (OLED), as a light emitting transistor, as a light emitting diode element or as an organic light emitting transistor. In various embodiments, the light emitting component can be part of an integrated circuit. Furthermore, a plurality of light emitting components can be provided, for example in a manner accommodated in a common housing.

Figure 1:
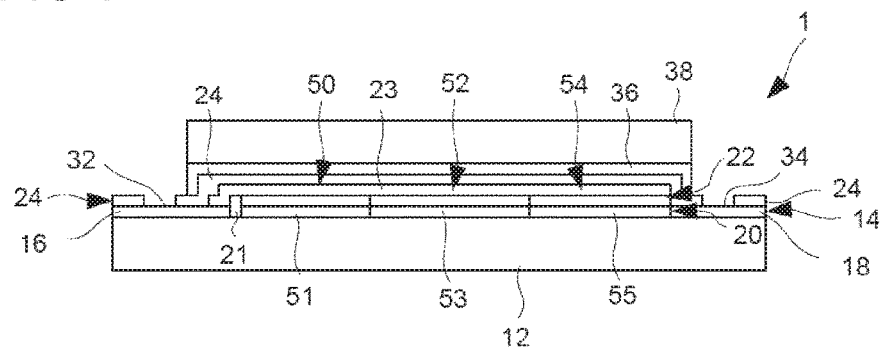
FIG. 1 shows a lateral sectional illustration of one embodiment of an optoelectronic assembly.

FIG. 1 shows an optoelectronic assembly, in particular an organic light emitting diode 1 (OLED). As an alternative thereto, the light emitting diode 1 can be an inorganic light emitting diode, in particular an LED, rather than an organic light emitting diode. The light emitting diode 1 includes a carrier 12. An optoelectronic layer structure is formed on the carrier 12.

The optoelectronic layer structure includes a first electrically conductive layer 14 including a first contact section 16, a second contact section 18 and a first electrode layer 20. The carrier 12 with the first electrically conductive layer 14 can also be designated as a substrate. The second contact section 18 is electrically coupled to the first electrode layer 20 of the optoelectronic layer structure; by way of example, the second contact section 18 and the first electrode layer are formed in an integral fashion. The first electrode layer 20 is electrically insulated from the first contact section 16 by means of an electrical insulation barrier 21. An optically functional layer structure, for example an organic functional layer structure 22, of the optoelectronic layer structure is formed above the first electrode layer 20. The organic functional layer structure 22 may include for example one, two or more partial layers formed one above another, as explained in greater detail further below with reference to FIG. 5. A second electrically conductive layer, in particular a second electrode layer 23, of the optoelectronic layer structure is formed above the organic functional layer structure 22, and is electrically coupled to the first contact section 16. The first electrode layer 20 serves for example as an anode or cathode of the optoelectronic layer structure. In a manner corresponding to the first electrode layer 20, the second electrode layer 23 serves as a cathode or anode of the optoelectronic layer structure.

The light emitting diode 1 includes at least two, for example three or more segments, for example a first segment, a second segment and a third segment. In other words, the light emitting diode 1 is segmented. The first segment is formed by a first light emitting diode element 50. The second segment is formed by a second light emitting diode element 52. The third segment is formed by a third light emitting diode element 54. The light emitting diode elements 50, 52, 54 include mutually separate segments of the organic functional layer structure 22 and mutually separate segments of the first electrode layer 20. In particular, the first electrode layer 20 includes a first electrode 51 of the first light emitting diode element 50, a first electrode 53 of the second light emitting diode element 52 and a first electrode 55 of the third light emitting diode element 54. If the light emitting diode 1 includes more or fewer segments, then the first electrode layer 20 includes correspondingly more or fewer first electrodes 51, 53, 55. Optionally, the light emitting diode elements 50, 52, 54 share the second electrode layer 23, which is not segmented. As an alternative thereto, in the case of the light emitting diode elements 50, 52, 54, the second electrode layer 23 can be segmented and/or the first electrode layer 20 can be formed in a non-segmented and/or integral fashion. Furthermore, in the case of a segmented electrode layer 20, 23 as well, the organic functional layer structure 22 can be formed in a non-segmented fashion, that is to say in an integral fashion. The first electrodes 51, 53, 55 can be electrically coupled to different regions (not illustrated) of the second contact section 18 that are electrically insulated from one another, such that the light emitting diode elements 50, 52, 54 can be operated independently of one another.

As an alternative thereto, the light emitting diode 1 can be unsegmented, that is to say include no segments, and/or consist of an individual light emitting diode element. Furthermore, the light emitting diode 1 can be electrically and/or mechanically coupled to one, two or more further light emitting diodes (not illustrated). By way of example, the corresponding light emitting diodes can be electrically connected in parallel, for example via an electrical connection of the first or second electrodes; by way of example, one of the electrodes of the various light emitting diodes can be formed in an integral fashion and extend over a plurality of light emitting diodes.

An encapsulation layer 24 of the optoelectronic layer structure is formed above the second electrode layer 23 and partly above the first contact section 16 and partly above the second contact section 18, said encapsulation layer encapsulating the optoelectronic layer structure. In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesion medium layer 36 is formed above the encapsulation layer 24. The adhesion medium layer 36 includes for example an adhesion medium, for example an adhesive, for example a lamination adhesive, a lacquer and/or a resin. A covering body 38 is formed above the adhesion medium layer 36. The adhesion medium layer 36 serves for fixing the covering body 38 to the encapsulation layer 24. The covering body 38 serves for protecting the light emitting diode 1, for example against mechanical force actions from outside. Furthermore, the covering body 38 can serve for spreading and/or dissipating heat generated in the light emitting diode 1. The substrate projects laterally below the covering body 38. As an alternative thereto, the substrate and the covering body 38 can be formed such that they are flush or almost flush at their side edges, wherein the contact regions 32, 34 can be contacted for example via cutouts and/or holes in the covering body 38 and/or in the carrier 12.

Figure 2:
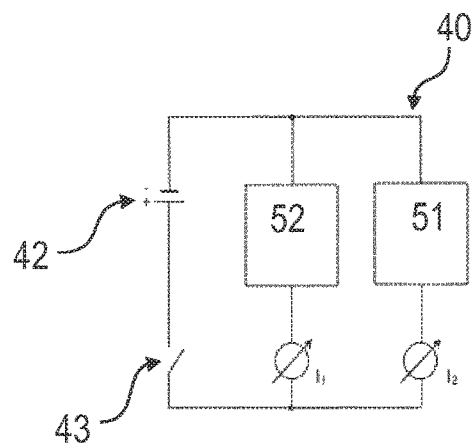
FIG. 2 shows a circuit diagram of one embodiment of an optoelectronic assembly.

FIG. 2 shows a circuit diagram of an optoelectronic assembly including a first light emitting diode element 51, for example formed like the first light emitting diode element explained above, and a second light emitting diode element 52, for example formed like the second light emitting diode element explained above. Furthermore, the optoelectronic assembly includes an electronic circuit 40. The electronic circuit 40 includes a first voltage source 42 for operating the light emitting diode elements 51, 52.

The light emitting diode elements 51, 52 are operated electrically in parallel. Preferably, the light emitting diode elements 51, 52 have as far as possible identical current-voltage characteristics.

The electronic circuit 40 furthermore includes an electronic circuit unit 43, which is illustrated as a simple switch for reasons of enabling simple illustration in FIG. 2. Said circuit unit 43 serves in particular to ascertain a conditional short circuit of one of the light emitting diode elements 51, 52 and correspondingly to react thereto. For this purpose, a current I1 that flows through the first light emitting diode element 51 during operation and a current I2 that flows through the second light emitting diode element 52 during operation are compared with one another by means of the circuit unit 43. During normal operation, currents of identical magnitude flow through both light emitting diode elements 51, 52. When a conditional short circuit occurs, the majority of the impressed current flows through the local defect. Depending on whether the local defect is situated in the first light emitting diode element 51 or in the second light emitting diode element 52, the current flow through the corresponding light emitting diode element increases, while the current flow through the other light emitting diode element decreases. As a result, when a conditional short circuit occurs, an increased difference magnitude of the currents I1, I2 occurs, as a result of which the conditional short circuit is detectable by comparing said currents I1, I2.

In the case of a conditional short circuit, that is to say in the case of an increased difference magnitude between the currents I1, I2, a switching off of the optoelectronic assembly is provided by means of the electronic circuit unit 43. In particular, a switching off of the optoelectronic assembly is initiated if a predefined, excessively large difference magnitude between the currents I1, I2 is present. For this purpose, the electronic circuit unit 43 compares a difference magnitude of the currents I1, I2 that flow through the individual light emitting diode elements 51, 52 with a predefined difference magnitude. If the resulting difference magnitude of the currents I1, I2 lies outside the predefined difference magnitude—plus a predefined deviation based on possible manufacturing tolerances of the light emitting diode elements 51, 52—at least one defective light emitting diode element 51, 52 should be assumed.

The comparison of the currents I1, I2 that flow through the light emitting diode elements 51, 52 and the switching off of the optoelectronic assembly that is carried out if appropriate can be carried out by an integrated microelectronic circuit (IC). In particular, in this case the electronic circuit unit 43 is or includes an IC.

By means of the detection of the conditional short circuit and the possible switching off of the optoelectronic assembly, it is advantageously possible to rule out an injury and fire hazard which can occur as a result of local heating in the case of a conditional short circuit.

As an alternative to the optoelectronic assembly discussed above, the light emitting diode elements 51, 52 of the assembly can have different active areas and, in a manner governed thereby, different current-voltage characteristics. This can occur for example in the case of light emitting diode elements manufactured in different processes. For detecting a conditional short circuit by means of the electronic circuit unit 43, the electronic circuit unit 43 is calibrated to the original difference magnitude of the currents I1, I2 during normal operation. In the case of an excessively great deviation from this calibrated difference magnitude, the assembly is correspondingly switched off. Furthermore, the light emitting diode elements can be mutually separate and/or different light emitting diodes which are electrically connected in parallel with one another.

As a further alternative to the optoelectronic assembly discussed above, the light emitting diode elements 51, 52 can be arranged in a manner stacked one above another by means of an intermediate electrode. In this case, a current comparison of the lower and upper light emitting diode elements is applied for detecting a conditional short circuit.

As a further alternative to the optoelectronic assembly discussed above, the optoelectronic assembly can also include a plurality of light emitting diode elements. For detecting a short circuit, the currents that flow through the individual light emitting diode elements are compared and the optoelectronic assembly is switched off if one light emitting diode element has a correspondingly higher current than the other light emitting diode elements.

As a further alternative to the assembly discussed above, merely switching off the defective light emitting diode element(s) 51, 52 can be provided instead of switching off the entire optoelectronic assembly. In this case, even when individual defects or short circuits occur, the optoelectronic assembly can continue to be operated without a combustion and/or fire hazard.

Alternatively or additionally, the detection of the conditional short circuit can be used for the quality control of the light emitting diode elements 51, 52, besides hazard reduction. If significantly different currents I1, I2 among the individual light emitting diode elements 51, 52 are already present in the test method after the manufacture of the optoelectronic assembly, then a defective optoelectronic assembly should be assumed.

Figure 3:
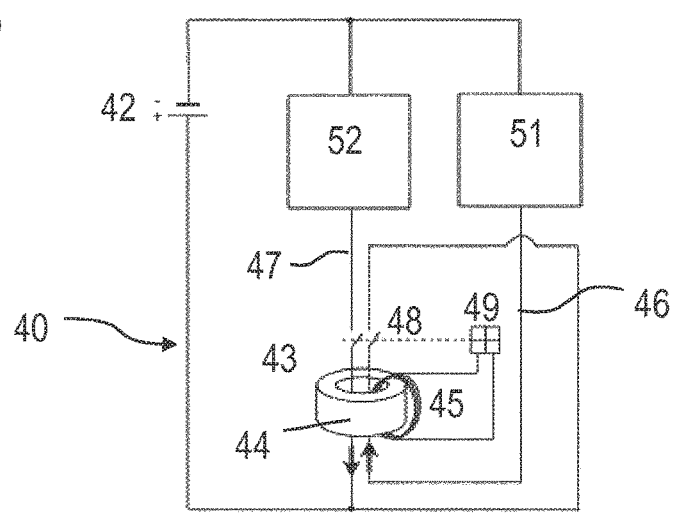
FIG. 3 shows a circuit diagram of one embodiment of an optoelectronic assembly.

FIG. 3 shows one embodiment of a circuit diagram of an optoelectronic assembly which for example can largely correspond to the optoelectronic assembly shown in FIG. 2. The optoelectronic assembly includes the parallel-connected light emitting diode elements 51, 52 and the electronic circuit 40. The electronic circuit 40 includes the voltage source 42 and the electronic circuit unit 43.

In contrast to the embodiment described in FIG. 2, the electronic circuit unit 43 is not formed as an IC. The electronic circuit unit 43 of the embodiment in FIG. 3 includes a summation current transformer 44, a coil 45, a first electrical line 46 of the first light emitting diode element 51 and a second electrical line 47 of the second light emitting diode element 52. In the case of the summation current transformer 44, two or more conductors are led through an inductive current transformer. The inductive current transformer has a primary winding, through which the current to be measured flows, and also a larger number of secondary windings. The primary winding includes a busbar led through the toroidal core of the transformer. The difference current from the conductors led through the inductive current transformer is transformed. As an alternative thereto, the summation current transformer 44 can be formed differently.

The coil 45 is wound or wrapped around the summation current transformer 44, for example. The first electrical line 46 and the second electrical line 47 are led through the summation current transformer 44. In this case, a current flow of the first electrical line 46 and a current flow of the second electrical line 47 are in opposite directions with respect to one another.

To put it another way, the lines 46, 47 of the light emitting diode elements 51, 52 run in opposite directions through a transformer core of the summation current transformer 44, such that the two currents add up to zero in a signed manner during normal operation.

If one of the light emitting diode elements 51, 52 then has a local defect, for example a conditional short circuit, the current flow through the corresponding light emitting diode element 51, 52 increases, while the current flow through the other light emitting diode element 51, 52 decreases. This gives rise to an increased difference magnitude of the currents of the light emitting diode elements 51, 52, in particular a difference magnitude different than zero. Said difference magnitude can be detected by the electronic circuit unit 43 and initiate a switching off of the optoelectronic assembly. The switching off is carried out by means of switches 48, for example. The switches 48 are triggered by means of a latch. In this case, each light emitting diode element 51, 52 can be switched off separately by means of a dedicated switch 48. Alternatively, of course, a common switching off can be provided by means of a common switch.

It should be noted here of course, that a summation of the currents to zero during normal operation and a corresponding deviation from said zero—taking account of a possible deviation on account of manufacturing tolerances—arise only in the case of light emitting diode elements 51, 52 which have as far as possible identical current-voltage characteristics. Alternative embodiments to this have already been explained in association with the embodiment concerning FIG. 2 and are correspondingly applied in the embodiment in FIG. 3, of course, without being explicitly explained again here.

The electronic circuit unit 43 of the embodiment in FIG. 3 is based on the principle of a conventional residual current protection circuit and is constructed and embodied correspondingly similarly thereto. A conventional residual current protection circuit is discussed in greater detail in the embodiment in FIG. 4.

Figure 4:
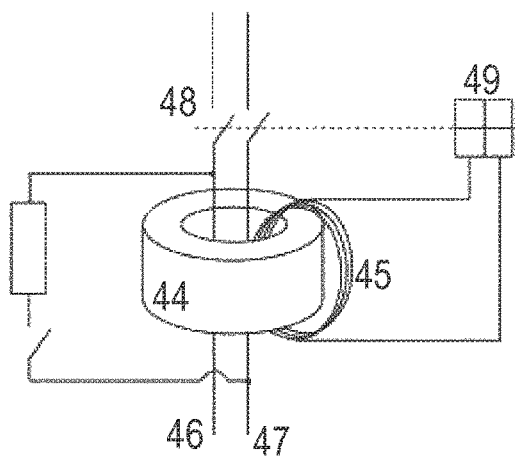
FIG. 4 shows an illustration of one embodiment of a conventional residual current circuit breaker.

FIG. 4 shows the principle of a conventional residual current protection circuit. A conventional residual current circuit breaker isolates the monitored electrical circuit when a specific difference current is exceeded. To put it another way, the residual current circuit breaker isolates the electrical circuit if a current that flows toward the load in one line 46 and a current that flows back from the load in another line 47 no longer have the same magnitude, that is to say if the signed currents no longer add up to zero.

Difference currents can occur if a fault current flows, for example via a local defect such as via a short circuit. To that end, the residual current circuit breaker compares the magnitude of the outgoing flowing current with that of the current flowing back. The signed sum of all the currents flowing through the residual current circuit breaker must be zero in the case of an intact installation, that is to say that the current toward the load must be of exactly the same magnitude as the current that flows back from the load.

The comparison is carried out in the summation current transformer 44, around which the coil 45 is wrapped. The summation current transformer 44 has two or more line wires 46, 47 (primary windings) running through. A current is induced in the coil 45 in the case where a magnetic field results in the summation current transformer 44 on account of the line wires 46, 47 running through. The line wires 46, 47 are led such that their induction effect mutually cancels one another out during normal operation, no magnetic flux is induced in the transformer core and no secondary current flows in the coil 45.

The transformer thus adds sign-correctly all currents flowing to and from the load by way of their magnetic fields in the transformer core. If a fault current flows from a line wire, then the sum of outgoing-flowing and flowing-back currents in the transformer is no longer zero. This results in a current in the coil 45. The secondary current triggers a relay (latch 49) which carries out all-pole switching off of the line by means of switches 48. In this context, the coil 45 can also be designated as a secondary winding or triggering coil.

Figure 5:
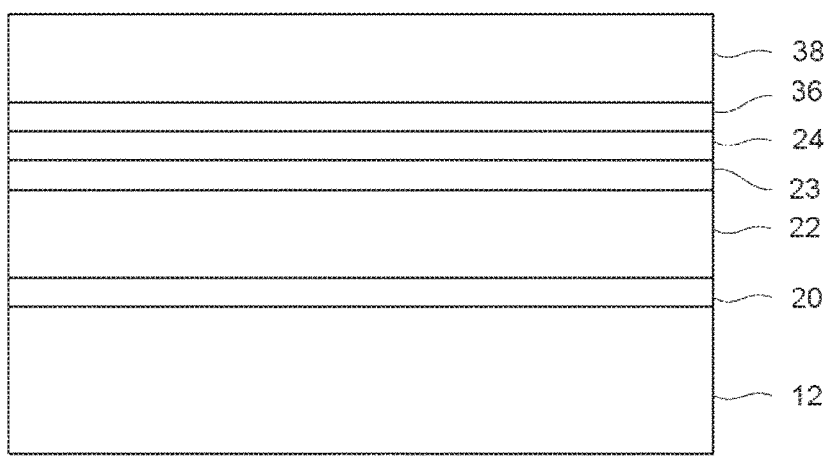
FIG. 5 shows a detailed sectional illustration of a layer structure of one embodiment of a light emitting diode element.

FIG. 5 shows a detailed sectional illustration of a layer structure of one embodiment of a light emitting diode element, for example of one of the light emitting diode elements 50, 52 explained above, which may be part of a light emitting diode 1, for example of the light emitting diode 1 explained above. The light emitting diode 1 can be formed as a top emitter and/or bottom emitter. If the light emitting diode 1 is formed as a top emitter and bottom emitter, the light emitting diode 1 can be designated as an optically transparent light emitting diode.

The light emitting diode 1 includes the carrier 12 and an active region above the carrier 12. A first barrier layer (not illustrated), for example a first barrier thin-film layer, can be formed between the carrier 12 and the active region. The active region includes the first electrode layer 20, the organic functional layer structure 22 and the second electrode layer 23. The encapsulation layer 24 is formed above the active region. The encapsulation layer 24 can be formed as a second barrier layer, for example as a second barrier thin-film layer. The covering body 38 is arranged above the active region and, if appropriate, above the encapsulation layer 24. The covering body 38 can be arranged on the encapsulation layer 24 by means of an adhesion medium layer 36, for example.

The active region is an electrically and/or optically active region. The active region is, for example, that region of the light emitting diode 1 in which electric current for the operation of the light emitting diode 1 flows and/or in which electromagnetic radiation is generated or absorbed.

The organic functional layer structure 22 may include one, two or more functional layer structure units formed one above another and one, two or more intermediate layers between the layer structure units. The organic functional layer structure 22 can be segmented in a lateral direction.

The carrier 12 can be formed as translucent or transparent. The carrier 12 serves as a carrier element for electronic elements or layers, for example light emitting elements. The carrier 12 may include or be formed from, for example, glass, quartz, and/or a semiconductor material or any other suitable material. Furthermore, the carrier 12 may include or be formed from a plastics film or a laminate including one or including a plurality of plastics films. The plastic may include one or a plurality of polyolefins. Furthermore, the plastic may include polyvinyl chloride (PVC), polystyrene (PS), polyester and/or polycarbonate (PC), polyethylene terephthalate (PET), polyethersulfone (PES) and/or polyethylene naphthalate (PEN). The carrier 12 may include or be formed from a metal, for example copper, silver, gold, platinum, iron, for example a metal compound, for example steel. The carrier 12 can be formed as a metal film or metal-coated film. The carrier 12 can be a part of a mirror structure or form the latter. The carrier 12 can have a mechanically rigid region and/or a mechanically flexible region or be formed in this way.

The first electrode layer 20 can be formed as an anode or as a cathode. The first electrode layer 20 can be formed as translucent or transparent. The first electrode layer 20 includes an electrically conductive material, for example metal and/or a transparent conductive oxide (TCO) or a layer stack of a plurality of layers including metals or TCOs. The first electrode layer 20 may include for example a layer stack of a combination of a layer of a metal on a layer of a TCO, or vice versa. One example is a silver layer applied on an indium tin oxide (ITO) layer (Ag on ITO) or ITO-Ag-ITO multilayers. The first electrode layer 20 can be segmented.

By way of example, Ag, Pt, Au, Mg, Al, Ba, In, Ca, Sm or Li, and compounds, combinations or alloys of these materials can be used as metal.

Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs.

The first electrode layer 20 may include, as an alternative or in addition to the materials mentioned: networks composed of metallic nanowires and nanoparticles, for example composed of Ag, networks composed of carbon nanotubes, graphene particles and graphene layers and/or networks composed of semiconducting nanowires. By way of example, the first electrode layer 20 may include or be formed from one of the following structures: a network composed of metallic nanowires, for example composed of Ag, which are combined with conductive polymers, a network composed of carbon nanotubes which are combined with conductive polymers, and/or graphene layers and composites. Furthermore, the first electrode layer 20 may include electrically conductive polymers or transition metal oxides.

The first electrode layer 20 can have for example a layer thickness in a range of 10 nm to 500 nm, for example of 25 nm to 250 nm, for example of 50 nm to 100 nm.

The first electrode layer 20 can have a first electrical terminal, to which a first electrical potential can be applied. The first electrical potential can be provided by an energy source (not illustrated), for example by a current source or a voltage source. Alternatively, the first electrical potential can be applied to the carrier 12 and the first electrode layer 20 can be supplied indirectly via the carrier 12. The first electrical potential can be for example the ground potential or some other predefined reference potential.

The organic functional layer structure 22 may include a hole injection layer, a hole transport layer, an emitter layer, an electron transport layer and/or an electron injection layer.

The hole injection layer can be formed on or above the first electrode layer 20. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methyl-phenyl)-N,N'-bis(phenyl)benzidine); spiro-TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methyl-phenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bisbiphenyl-4-yl-amino)phenyl]-9H-fluorene; 9, 9-bis[4-(N,N-bisnaphthalen-2-yl-amino)phenyl]-9H-fluorene; 9, 9-bis[4-(N,N'-bisnaphthalen-2-yl-N,N'-bisphenylamino)phenyl]-9H-fluorene; N,N'-bis-(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-di-tolylamino)phenyl]cyclohexane; 2,2',7,7'-tetra(N,N-ditolyl)-aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

The hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis-(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis-(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)-benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolylamino)phenyl]cyclohexane; 2,2',7,7'-tetra(N,N-ditolyl)aminospirobifluorene; and N,N,N',N'-tetranaphthalen-2-ylbenzidine.

The hole transport layer can have a layer thickness in a range of approximately 5 nm to approximately 50 nm, for example in a range of approximately 10 nm to approximately 30 nm, for example approximately 20 nm.

One or a plurality of emitter layers, for example including fluorescent and/or phosphorescent emitters, can be formed on or above the hole transport layer. The emitter layer may include organic polymers, organic oligomers, organic monomers, organic small, non-polymeric molecules ("small molecules") or a combination of these materials. The emitter layer may include or be formed from one or a plurality of the following materials: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine]ruthenium(III) complex) and blue fluorescent DPAVBi (4,4-bis[4-(di-p-tolylamino)styryl]-biphenyl), green fluorescent TTPA (9,10-bis[N,N-di(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spin coating method. The emitter materials can be embedded in a suitable manner in a matrix material, for example a technical ceramic or a polymer, for example an epoxy; or a silicone.

The first emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively or additionally, provision can be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The electron transport layer can be formed, for example deposited, on or above the emitter layer. The electron transport layer may include or be formed from one or a plurality of the following materials: NET-18; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)-borane; 1-methyl-2-(4-(naphthalen-2-yl)phenyl)-1H-imidazo-[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

The electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f] [1, 10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 22 including two or more organic functional layer structure units, corresponding intermediate layers can be formed between the organic functional layer structure units. The organic functional layer structure units can be formed in each case individually by themselves in accordance with a configuration of the organic functional layer structure 22 explained above. The intermediate layer can be formed as an intermediate electrode. The intermediate electrode can be electrically connected to an external voltage source. The external voltage source can provide a third electrical potential, for example, at the intermediate electrode.

However, the intermediate electrode can also have no external electrical terminal, for example by the intermediate electrode having a floating electrical potential.

The organic functional layer structure unit can have for example a layer thickness of a maximum of approximately 3 μm, for example a layer thickness of a maximum of approximately 1 μm, for example a layer thickness of a maximum of approximately 300 nm.

The light emitting diode 1 can optionally include further functional layers, for example arranged on or above the one or the plurality of emitter layers or on or above the electron transport layer. The further functional layers can be for example internal or external coupling-in/coupling-out structures that can further improve the functionality and thus the efficiency of the light emitting diode 1.

The second electrode layer 23 can be formed in accordance with one of the configurations of the first electrode layer 20, wherein the first electrode layer 20 and the second electrode layer 23 can be formed identically or differently. The second electrode layer 23 can be formed as an anode or as a cathode. The second electrode layer 23 can have a second electrical terminal, to which a second electrical potential can be applied. Optionally, the second electrode layer 23 can be segmented. The second electrical potential can be provided by the same energy source as, or a different energy source than, the first electrical potential. The second electrical potential can be different than the first electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation layer 24 can also be designated as thin-film encapsulation. The encapsulation layer 24 can be formed as a translucent or transparent layer. The encapsulation layer 24 forms a barrier against chemical impurities or atmospheric substances, in particular against water (moisture) and oxygen. In other words, the encapsulation layer 24 is formed in such a way that substances that can damage the light emitting diode 1, for example water, oxygen or solvent, cannot penetrate through it or at most very small proportions of said substances can penetrate through it. The encapsulation layer 24 can be formed as an individual layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon 66, and mixtures and alloys thereof.

The encapsulation layer 24 can have a layer thickness of approximately 0.1 nm (one atomic layer) to approximately 1000 nm, for example a layer thickness of approximately 10 nm to approximately 100 nm, for example approximately 40 nm. The encapsulation layer 24 may include a high refractive index material, for example one or a plurality of material(s) having a high refractive index, for example having a refractive index of 1.5 to 3, for example of 1.7 to 2.5, for example of 1.8 to 2.

If appropriate, the first barrier layer can be formed on the carrier 12 in a manner corresponding to a configuration of the encapsulation layer 24.

The encapsulation layer 24 can be formed for example by means of a suitable deposition method, e.g. by means of an atomic layer deposition (ALD) method, e.g. a plasma enhanced atomic layer deposition (PEALD) method or a plasmaless atomic layer deposition (PLALD) method, or by means of a chemical vapor deposition (CVD) method, e.g. a plasma enhanced chemical vapor deposition (PECVD) method or a plasmaless chemical vapor deposition (PLCVD) method, or alternatively by means of other suitable deposition methods.

If appropriate, a coupling-in or coupling-out layer can be formed for example as an external film (not illustrated) on the carrier 12 or as an internal coupling-out layer (not illustrated) in the layer cross section of the light emitting diode 1. The coupling-in/-out layer may include a matrix and scattering centers distributed therein, wherein the average refractive index of the coupling-in/-out layer is greater than the average refractive index of the layer from which the electromagnetic radiation is provided. Furthermore, in addition, one or a plurality of antireflection layers can be formed.

The adhesion medium layer 36 may include adhesive and/or lacquer, for example, by means of which the covering body 38 is arranged, for example adhesively bonded, on the encapsulation layer 24, for example. The adhesion medium layer 36 can be formed as transparent or translucent. The adhesion medium layer 36 may include for example particles which scatter electromagnetic radiation, for example light-scattering particles. As a result, the adhesion medium layer 36 can act as a scattering layer and lead to an improvement in the color angle distortion and the coupling-out efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the adhesion medium layer 36, for example air bubbles, acrylate, or hollow glass beads. Furthermore, by way of example, metallic nanoparticles, metals such as gold, silver, iron nanoparticles, or the like can be provided as light-scattering particles.

The adhesion medium layer 36 can have a layer thickness of greater than 1 μm, for example a layer thickness of a plurality of μm. In various embodiments, the adhesive can be a lamination adhesive.

The adhesion medium layer 36 can have a refractive index that is less than the refractive index of the covering body 38. The adhesion medium layer 36 may include for example a low refractive index adhesive such as, for example, an acrylate having a refractive index of approximately 1.3. However, the adhesion medium layer 36 can also include a high refractive index adhesive which for example includes high refractive index, non-scattering particles and has a layer-thickness-averaged refractive index that approximately corresponds to the average refractive index of the organic functional layer structure 22, for example in a range of approximately 1.6 to 2.5, for example of 1.7 to approximately 2.0.

A so-called getter layer or getter structure, i.e. a laterally structured getter layer, can be arranged (not illustrated) on or above the active region. The getter layer can be formed as translucent, transparent or opaque. The getter layer may include or be formed from a material that absorbs and binds substances that are harmful to the active region. A getter layer may include or be formed from a zeolite derivative, for example. The getter layer can have a layer thickness of greater than 1 μm, for example a layer thickness of a plurality of μm. In various embodiments, the getter layer may include a lamination adhesive or be embedded in the adhesion medium layer 36.

The covering body 38 can be formed for example by a glass body, a metal film or a sealed plastics film covering body. The covering body 38 can be arranged on the encapsulation layer 24 or the active region for example by means of frit bonding (glass frit bonding/glass soldering/seal glass bonding) by means of a conventional glass solder in the geometrical edge regions of the light emitting diode 1. The covering body 38 can have for example a refractive index (for example at a wavelength of 633 nm) of for example 1.3 to 3, for example of 1.4 to 2, for example of 1.5 to 1.8.

The present disclosure is not restricted to the embodiments indicated. By way of example, the light emitting diode 1 may include more or fewer light emitting diode elements 50, 52. Alternatively or additionally, the optoelectronic assembly may include more or fewer light emitting diodes 1, light emitting diode elements 50, 52 and/or corresponding circuits. Furthermore, instead of the light emitting diode 1 including the light emitting diode elements 50, 52, the light emitting diode elements 50, 52 can be replaced by mutually independent light emitting diodes 1 in all the embodiments.

In accordance with various embodiments, an optoelectronic assembly includes: at least one first light emitting diode element 51, a second light emitting diode element 52 and an electronic circuit 40, wherein the first light emitting diode element 51 and the second light emitting diode element 52 are electrically connected in parallel, the electronic circuit 40 is designed to compare an electric current through the first light emitting diode element 51 that flows during operation with an electric current through the second light emitting diode element 52 that flows during operation, and the electronic circuit 40 is designed to detect at least one electrical property of the first light emitting diode element 51 or of the second light emitting diode element 52 depending on the comparison.

In accordance with various embodiments, the at least one electrical property is a short circuit of the corresponding light emitting diode element 51, 52.

In accordance with various embodiments, the at least one electrical property is an electrical conductivity of the corresponding light emitting diode element 51, 52.

In accordance with various embodiments, the at least one electrical property is a current flow through the corresponding light emitting diode element 51, 52.

In accordance with various embodiments, the electronic circuit 40 is designed to detect the at least one electrical property in the case of a difference magnitude of the currents to be compared which exceeds a predefined difference magnitude.

In accordance with various embodiments, the electronic circuit 40 is designed, upon exceedance, to initiate an electrical switching off of one of the light emitting diode elements 51, 52 and/or of the assembly.

In accordance with various embodiments, the electronic circuit 40 includes a summation current transformer 44, a coil 45, a first electrical line 46 of the first light emitting diode element 51 and a second electrical line 47 of the second light emitting diode element 52, wherein the coil 45 is wound around the summation current transformer 44, the first electrical line 51 and the second electrical line 52 are led through the summation current transformer 44, and a current flow of the first electrical line 51 and a current flow of the second electrical line 52 are in opposite directions.

In accordance with various embodiments, the optoelectronic assembly includes a plurality of light emitting diode elements 51, 52, wherein the electronic circuit 40 is designed respectively to determine an electric current through each light emitting diode element 51, 52 that flows during operation and to compare the currents of the light emitting diode elements 51, 52 with one another, and the electronic circuit 40 is designed to initiate an electrical switching off of one of the light emitting diode elements 51, 52 and/or of the assembly depending on the comparison.

In accordance with various embodiments, the first light emitting diode element 51 and the second light emitting diode element 52 are deposited monolithically on a common substrate.

In accordance with various embodiments, the first light emitting diode element 51 and the second light emitting diode element 52 are arranged in a manner stacked one above another or laterally alongside one another.

In accordance with various embodiments, in a method for detecting an electrical property of a first light emitting diode element 51 or of a second light emitting diode element 52, the first light emitting diode element 51 and the second light emitting diode element 52 are operated electrically in parallel, and an electric current through the first light emitting diode element 51 that flows during operation is compared with an electric current through the second light emitting diode element 52 that flows during operation by means of an electronic circuit 40, and the electrical property is detected depending on the comparison.

In accordance with various embodiments, a short circuit of the first light emitting diode element 51 or of the second light emitting diode element 52 is detected as the electrical property.

In accordance with various embodiments, the short circuit is detected in the case where a difference magnitude of the compared currents exceeds a predefined difference magnitude.

In accordance with various embodiments, an electrical switching off of at least one of the light emitting diode elements 51, 52 is initiated when the predefined difference magnitude is exceeded.

In accordance with various embodiments, in each case an electric current through a plurality of light emitting diode elements 51, 52 that flows during operation is determined by means of the electronic circuit 40, the currents of the light emitting diode elements 51, 52 are compared with one another by means of the electronic circuit 40, and one or more of the light emitting diode elements 51, 52 are electrically switched off depending on the comparison.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic assembly comprising at least one organic light emitting diode comprising a first light emitting diode element and a second light emitting diode element, and an electronic circuit, wherein
   the first light emitting diode element and the second light emitting diode element are electrically connected in parallel and are deposited monolithically on a common substrate, and
   the electronic circuit is designed to compare an electric current through the first light emitting diode element that flows during operation with an electric current through the second light emitting diode element that flows during operation and, depending on the comparison, to detect a short circuit of the first light emitting diode element or of the second light emitting diode element and to initiate an electrical switching off of one of the light emitting diode elements and/or of the assembly,
   the electronic circuit comprises a summation current transformer, a coil, a first electrical line of the first light emitting diode element and a second electrical line of the second light emitting diode element,
   the coil is wound around the summation current transformer,
   the first electrical line and the second electrical line are led through the summation current transformer, and
   a current flow of the first electrical line and a current flow of the second electrical line are in opposite directions.

2. The optoelectronic assembly as claimed in claim 1, wherein the electronic circuit is designed to detect the short circuit in the case of a difference magnitude of the currents to be compared which exceeds a predefined difference magnitude.

3. The optoelectronic assembly as claimed in claim 1, wherein the first light emitting diode element and the second light emitting diode element are arranged in a manner stacked one above another or laterally alongside one another.

4. A method for detecting a short circuit of a first light emitting diode element or of a second light emitting diode element of an organic light emitting diode, wherein
   the first light emitting diode element and the second light emitting diode element are operated electrically in parallel and are deposited monolithically on a common substrate,
   an electric current through a first electrical line of the first light emitting diode element that flows during operation is compared with an electric current through a second electrical line of the second light emitting diode element that flows during operation by means of an electronic circuit comprising a summation current transformer, a coil, the first electrical line of the first light emitting diode element and the second electrical line of the second light emitting diode element, wherein the coil is wound around the summation current transformer, wherein the first electrical line and the second electrical line are led through the summation current transformer, and wherein the current flow of the first electrical line and a current flow of the second electrical line are in opposite directions, and
   the short circuit is detected and an electrical switching off of one of the light emitting diode elements and/or of the assembly is initiated depending on the comparison.

5. The method as claimed in claim 4, wherein the short circuit is detected in the case where a difference magnitude of the compared currents exceeds a predefined difference magnitude.

* * * * *